United States Patent [19]
Mohammed

[11] Patent Number: 4,654,248
[45] Date of Patent: Mar. 31, 1987

[54] PRINTED WIRING BOARD WITH ZONES OF CONTROLLED THERMAL COEFFICIENT OF EXPANSION

[75] Inventor: Juzer Mohammed, Naperville, Ill.

[73] Assignee: GTE Communication Systems Corporation, Northlake, Ill.

[21] Appl. No.: 809,655

[22] Filed: Dec. 16, 1985

[51] Int. Cl.⁴ .................... B32B 3/10; B32B 27/00
[52] U.S. Cl. .................... 428/137; 428/209; 428/212; 428/285; 428/408; 428/473.5; 428/901; 174/68.5
[58] Field of Search ............... 174/68.5; 428/209, 212, 428/251, 285, 286, 290, 137, 138, 417, 435, 436, 473.5, 408, 901, 902

[56] References Cited

U.S. PATENT DOCUMENTS

| | | | |
|---|---|---|---|
| 3,801,880 | 4/1974 | Harada et al. | 317/234 R |
| 3,897,588 | 7/1975 | Nohtomi | 428/436 |
| 3,955,024 | 5/1976 | Goldman et al. | 428/209 |
| 3,956,561 | 5/1976 | Anderson et al. | 428/288 |
| 4,318,954 | 3/1982 | Jensen | 428/209 |
| 4,388,136 | 6/1983 | Huie et al. | 156/252 |
| 4,496,793 | 1/1985 | Hanson et al. | 174/68.5 |
| 4,526,835 | 7/1985 | Takahashi et al. | 428/413 |

FOREIGN PATENT DOCUMENTS

0008776 1/1978 Japan .
0033088 3/1980 Japan .
0019159 4/1983 Japan .

Primary Examiner—John E. Kittle
Assistant Examiner—Patrick J. Ryan
Attorney, Agent, or Firm—Robert J. Black

[57] ABSTRACT

A printed wiring board with zones therein of controlled thermal coefficient of expansion including a first layer of first material, a second layer of second material and a third layer of a third material positioned between the first and the second layers. The third layer includes a first area whereat the material is removed and replaced with a control material possessing a thermal coefficient of expansion different from the first, second and third layers. The third layer and the control material each possess a first side bonded to a first side of the first layer and a second side bonded to a first side of a second layer to form the printed wiring board. Electronic components may be mounted on a second side of the first layer, the second layer, or both the first and second layers and the control material may be varied in composition and thickness to change thermal expansion in the zone above and below the control material. The control material may be thermally conductive and extend to a side of the board where it may contact a heat sinking board guide to provide a path for dissipating heat generated by the electronic components.

22 Claims, 1 Drawing Figure

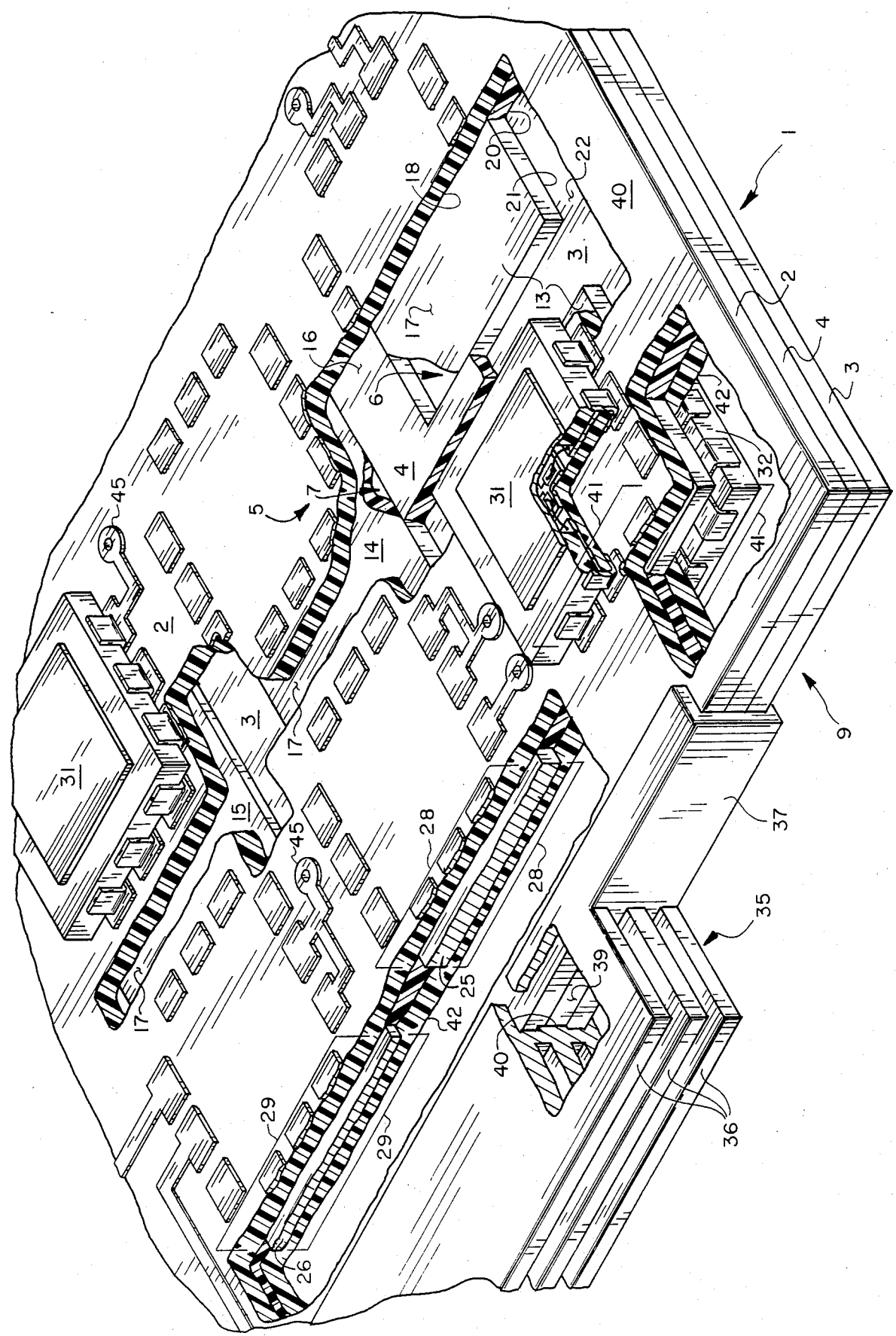

PRINTED WIRING BOARD WITH ZONES OF CONTROLLED THERMAL COEFFICIENT OF EXPANSION

BACKGROUND OF THE INVENTION (1) Field of the Invention

The present invention relates to printed wiring boards and, more particularly, to a printed wiring board with zones of controlled thermal coefficient of expansion.

(2) Background Art

Printed wiring boards possessing a controlled thermal coefficient of expansion are very well known to those skilled in the art. In this regard, U.S. Pat. No. 3,794,887 to Brennan et al. teaches a printed circuit board including a plurality of flexible metal webs secured to a frame at their ends. A printed wiring board is secured to the webs so that each web has a free length between the frame and the adjacent edge of the printed wiring board. The webs provide a thermal path and isolation from vibration as well as a electrical path to the printed wiring board.

U.S. Pat. No. 4,318,954 to Jensen teaches a composite printed wiring board including a surface fabricated from fiber of glass reinforced epoxy laminates secured by means of thermal set adhesive to a support member which is fabricated from graphite film and reinforced thermal set resin having a low coefficient of thermal expansion approaching zero. The unrestrained coefficient of thermal expansion of the printed wiring board is significantly greater than that of the support member. However, the composite assembly possesses a thermal expansion coefficient greatly reduced from that of the glass fiber reinforced epoxy and approaching that of a ceramic chip carrier.

U.S. Pat. No. 4,495,378 to Dotzer et al. teaches a circuit board consisting of a flat core plate of metallic material, graphite or electrically conductive carbon with a coating of electroplated aluminum eloxal. A conductor run structure may be generated on the aluminum eloxal layer to provide circuit interconnections.

U.S. Pat. No. 4,496,793 to Hanson et al. teaches a multilayer circuit board laminate which includes one or more stabilizing metal sheets for reducing the thermal coefficient of expansion of the laminate. The circuit board laminate disclosed is particularly useful in conjunction with leadless components and incorporates one or more stabilizing metal sheets into the composite multilayer board laminate assembly to stabilize the laminates thermal coefficient of expansion thereby enabling the laminate to be used in conjunction with leadless electronic components. The stabilizing layer may be formed of a composite metal dielectric laminate enabling the layer to be provided with a noncontinuous floating type pattern.

The above cited art while teaching various methods of controlling thermal coefficient of expansion and variously removing heat generated by electronic components, is not seen to teach the use of a stabilizing layer to control thermal coefficient of expansion and to remove heat in the manner taught by the present invention.

SUMMARY OF THE INVENTION

The present invention provides a board with zones therein of controlled coefficient of expansion including a first layer of a first material possessing a first thermal coefficient of expansion, a second layer of a second material possessing a second thermal coefficient of expansion, and a third layer of a third material possessing a third thermal coefficient of expansion, the third layer positioned between the first and the second layers and bonded to the first and second layers. A zone is provided in the third layer whereat the third material is removed and replaced with a portion of a fourth control material possessing a fourth thermal coefficient of expansion. The fourth material may be bonded to adjacent portions of the first and the second layer to provide a board with zones of controlled thermal coefficient of expansion.

The zones may be square or rectangular in form and alternately may be in the form of strips extending to opposite side edges of the printed wiring board. Electronic components may be mounted on an upper and a lower surface of the printed wiring board in the zones of controlled thermal coefficient of expansion. Circuit path vias may be formed extending between the upper and lower board surfaces at points not intersecting the control material. Finally, the thermal coefficient of expansion of the various zones may be varied within a given printed wiring board by varying the composition, thickness, or both composition and thickness of the control material, all within a single printed wiring board, to compensate for electronic components generating varying degrees of thermal energy in operation.

BRIEF DESCRIPTION OF THE DRAWING

An understanding of the present invention will be apparent from the following description taken in conjunction with the accompanying drawing depicting a perspective view of a printed wiring board in accordance with the present invention.

DESCRIPTION OF THE PREFERRED EMBODIMENT

Referring now to the FIGURE there is shown a printed wiring board 1 including a first layer 2, a second layer 3 and a third layer 4 positioned between the upper layer 2 and the lower layer 3. A plurality of areas 5 are formed in the third layer 4 at predetermined locations. The areas 5 may be in the form of a square or quadrilateral area 6 or alternately may be formed in the shape of a channel area 7 extending between a first side edge 9 and a second opposite side edge 10 (not shown) of the printed wiring board 1. A control material possessing a thermal coefficient of expansion different from that of the first, second and third layers 2, 3, and 4 of the printed wiring board 1 may be formed into sections and positioned within each of the areas 5 in the third layer 4 of the printed wiring board 1.

In this regard, the control material may be formed into a square or quadrilateral section 13 and positioned with each of the areas 6 in the third layer 4 of the printed wiring board 1. The contol material may alternately be formed into strips 14 and 15 and positioned in corresponding zones of the channel areas 7 in the third layer 4 of the printed wiring board 1. The first layer 2 may bonded to a first surface 16 of the third layer 4 and a first surface 17 of the control material 12 via a first surface 18. Similarly, the second layer 3 may be bonded to a second surface 20, the third layer 4 and a second surface 21 the control material 12 via a first surface 22.

The first, second and third layers 2, 3 and 4 may be composed of fiber glass cloth or alternately may be constructed of fiber glass cloth impregnated with epoxy or polyimide resin. The control material may be constructed of a graphite cloth or alternately, a cloth of aromatic polyamide fiber impregnated with epoxy or polyimide resin. Where it is desired to employ aromatic polyamide fiber, it is anticipated that a cloth woven of aromatic polyamide fiber material may be utilized impregnated with either epoxy or polyimide resin to form the control material of the present invention.

In addition to varying the composition of the control material, it is anticipated that the thickness of the sections 13, 14 and 15 may be modified to control thermal expansion. In this regard, there is shown in the FIGURE the strip 14 of the control material 12 extending between the first side 9 and the second side 10 of the printed wiring board 1 and possessing a first thickness dimension 25, and the second strip 15 of the control material 12 also extending between the first side 9 and second side 10 of the printed wiring board 1 and having a second thickness dimension 26 less than the thickness dimension 25 of the strip 14. The strips 14 and 15 cooperate with portions of the first layer 2 and the second layer 3 immediately adjacent each of the strips to produce thereat a first and a second zone of controlled thermal coefficient of expansion 28 and 29. The greater thickness 25 of the first strip 14 within the controlled zone 28 with respect to the second strip 15 within the zone of controlled thermal expansion 29, will result in the coefficient of expansion in the first controlled zone 28 being less than that in the second controlled zone 29. A second zone 29 will possess a greater thermal coefficient of expansion due to the reduced thickness dimension 26 of the strip 15 within the zone, thereby permitting the thermal expansion coefficients of the first layer 2 and the second layer 3 to produce a greater effect on the second controlled zone 29.

The strips 14 and 15 may be constructed of a thermally conductive material and thus may provide a path through which heat, generated by a plurality of electronic components 31 and 32, mounted on the printed wiring board 1, may be carried away.

To aid in dissipating such heat, a printed wiring board guide with heat sinking capabilities may be provided. In this regard, a heat sinking card guide 35 may be provided including a plurality of heat sinking fins 36 attached to a board guide portion 37. The board guide portion 37, in the area adjacent the edges 39 of the strips 14 and 15 may include a raised surface 40 to insure secure thermal contact with the edges 39 of the strips.

The thermal control zones will permit the mounting of electronic components on one or both sides of the printed wiring board 1. In this regard, the electronic components 31 may be mounted on a second side of the first layer 2 above a third zone of controlled thermal coefficient of expansion zone 41 formed above and below by the portion 13 of the control material. The second electronic component 32 may be mounted on a second side 42 of the second layer 3 also in the controlled zone 41 in similar manner.

It is anticipated, when the control material 12 utilizing graphite cloth is employed in the present invention, that a plurality of plated vias 45 serving to establish a circuit connection between the second sides of the first and second layers be formed at locations on the printed wiring board 1 where they will not pass through the control materials. In this regard, the plated vias 45 may be formed extending between the second side 40 of the first layer 2 and the second side 42 of the second layer 3 at a location between the zones of controlled thermal coefficient of expansion 28 and 29. Such location will permit the vias 45 to pass through the printed wiring board 1 without intersecting either of the control material strips 14 or 15. The vias 45 may additionally be positioned to avoid intersecting the section 13 of the control material 12.

Although the preferred embodiments of the present invention have been illustrated, and their forms described in detail, it will be readily apparent to those skilled in the art that various modifications may be made therein without departing from the spirit of the invention or from the scope of the appended claims.

What is claimed is:

1. A printed wiring board with zones therein of controlled thermal coefficient of expansion comprising:
    a first layer of a first material including a at least a first side;
    a second layer of a second material including at least a first side;
    a third layer of a third material including a a first and a second side, said third layer positioned between said first and said second layers;
    at least a first area in said third layer whereat said third material is removed;
    at least one section of a fourth control material possessing a thermal coefficient of expansion different from that of said first, second and third layers, and at least a first and a second side, said fourth material positioned within said first area in said third layer, said first side of said first layer bonded to said first side of said third layer and to said first side of said fourth material, said first side of said second layer bonded to said second side of said third layer and to said second side of said fourth material, whereby a printed wiring board with a first zone of controlled thermal coefficient of expansion is realized.

2. A printed wiring board as claimed in claim 1, wherein: said first zone is in the form of a strip extending between at least a first and a second opposite edge of said board.

3. A printed wiring board as claimed in claim 1, wherein: said first zone is in the form of a quadrilateral area located at a predetermined location of said board, said area isolated from a peripheral edge of said board.

4. A printed wiring board as claimed in claim 3, wherein: said area is isolated from all peripheral edges of said board.

5. A printed wiring board as claimed in claim 2, wherein: said fourth material is thermally conductive and said board includes a heat dissipation means in contact with said fourth material.

6. A printed wiring board as claimed in claim 1, wherein: said first material includes epoxy impregnated glass cloth.

7. A printed wiring board as claimed in claim 1, wherein: said second material includes epoxy impregnated glass cloth.

8. A printed wiring board as claimed in claim 1, wherein: said third material includes epoxy impregnated glass cloth.

9. A printed wiring board as claimed in claim 1, wherein: said fourth material includes a cloth of aromatic polyamide fiber impregnated with epoxy.

10. A printed wiring board as claimed in claim 1, wherein: said fourth material includes epoxy impregnated graphite cloth.

11. A printed wiring board as claimed in claim 1, wherein: said thermal coefficients of expansion of said first, second, and third materials are greater than said thermal coefficient of expansion of said fourth material.

12. A printed wiring board as claimed in claim 1, wherein: said first, second, third, and fourth materials include epoxy.

13. A printed wiring board as claimed in claim 1, wherein: said first, second, third, and fourth materials include polyimide.

14. A printed wiring board as claimed in claim 1, wherein: said board includes at least a second area in said third layer whereat said third material is removed and at least one section of a fifth material possessing a thermal coefficient of expansion different from that of said first, second and third layers, said fifth material positioned within said second area in said third layer, bonded to said first layer first side via a first side and bonded to said second layer second side via a second side, whereby a second zone of controlled thermal expansion is realized.

15. A printed wiring board as claimed in claim 14, wherein: said thermal coefficients of expansion of said fourth and fifth materials are different.

16. A printed wiring board as claimed in claim 14, wherein: said thermal coefficients of expansion of said fourth and fifth materials are identical.

17. A printed wiring board as claimed in claim 1, wherein: said board is adapted to mount at least one electronic component on a second side of said first layer and in the alternative on a second side of said second layer said component mounted adjacent to said first zone.

18. A printed wiring board as claimed in claim 1, wherein: said board is adapted to mount an electronic component on a second side of both said first and said second layers, said components each mounted adjacent to said first zone.

19. A printed wiring board as claimed in claim 1, wherein: said first zone is free of apertures therethrough.

20. A printed wiring board as claimed in claim 14, wherein: said second zone is free of apertures therethrough.

21. A printed wiring board as claimed in claim 1, wherein: said one section of said fourth material is of a predetermined thickness and said thermal coefficient of expansion of said fourth material is partially determined by said predetermined thickness of said material.

22. A printed wiring board as claimed in claim 14, wherein: said one section of said fifth material is of a predetermined thickness and said thermal coefficient of expansion of said fifth material is partially determined by said predetermined thickness of said material.

* * * * *